United States Patent [19]

Taniguchi et al.

[11] 4,437,002
[45] Mar. 13, 1984

[54] PYROELECTRIC INFRARED SENSOR

[75] Inventors: Yoshiharu Taniguchi; Shigeki Edano; Masanori Akiyama, all of Tottori, Japan

[73] Assignee: Nihon Ceramic Co., Ltd., Tottori, Japan

[21] Appl. No.: 254,433

[22] Filed: Apr. 15, 1981

[30] Foreign Application Priority Data

Apr. 21, 1980 [JP] Japan .............................. 55-55134[U]
Apr. 21, 1980 [JP] Japan .............................. 55-55135[U]
May 9, 1980 [JP] Japan .............................. 55-64031[U]

[51] Int. Cl.³ ............................................. G01J 1/42
[52] U.S. Cl. .................................... 250/338; 250/342
[58] Field of Search ............... 250/338, 352, 342, 340, 250/349; 29/592 R

[56] References Cited

U.S. PATENT DOCUMENTS

| | | | |
|---|---|---|---|
| 3,480,777 | 11/1969 | Astheimer | 250/349 |
| 3,539,803 | 11/1970 | Beerman | 250/338 |
| 4,214,165 | 7/1980 | Asawa | 250/338 |
| 4,218,620 | 8/1980 | Oettel | 250/338 |
| 4,284,888 | 8/1981 | Appleby | 250/338 |
| 4,302,674 | 11/1981 | Adachi et al. | 250/338 |
| 4,322,124 | 3/1982 | Padgitt et al. | 250/338 |

Primary Examiner—Alfred E. Smith
Assistant Examiner—Carolyn E. Fields
Attorney, Agent, or Firm—Irving M. Weiner; Pamela S. Burt; John L. Shortley

[57] ABSTRACT

A pyroelectric infrared sensor for use in intrusion alarm systems, including a pyroelectric ceramic element provided with two pairs of electrodes, of which the front electrodes are so configured as to permit a simplified printing process for higher productivity and lower production costs. The front electrodes each have a first region overlapping with a part of one of the back electrodes and a second region overlapping with a part of the other of the back electrodes, and are arranged adjacent to each other and are electrically insulated from each other. The first regions and the second regions of the front electrodes have a ratio of areas of approximately 1:1. The pyroelectric element is attached to a holding member which is so designed that the back electrode areas of the element are free from physical contact with any thermally conductive solid material that may detract from the thermal responsiveness of the element. The element is accommodated in a protective can, wherein the distance between the element and the back surface of a supporting stem is maximized so as to minimize the thermally hazardous contamination via the back surface of the stem facing a thermal body and thus to stabilize the characteristic of the sensor.

6 Claims, 7 Drawing Figures

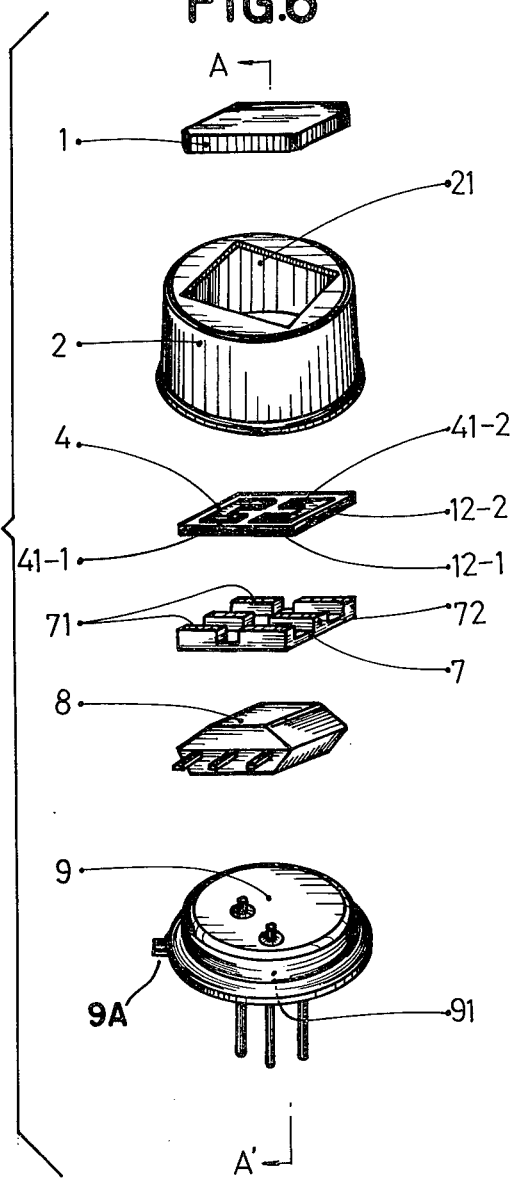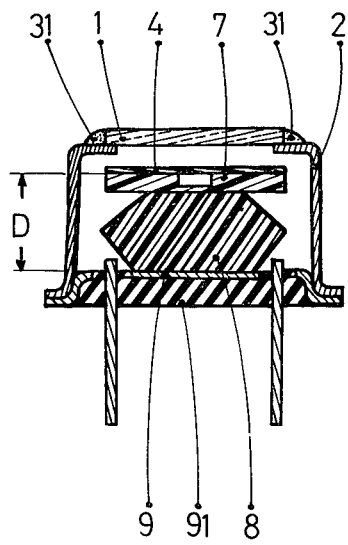

PYROELECTRIC INFRARED SENSOR

BACKGROUND OF THE INVENTION

1. Field of the Invention

The present invention relates generally to a pyroelectric infrared sensor. More particularly, the invention relates to an improved configuration of electrodes and the structure of sensors for use in intrusion alarm systems.

2. Description of Relevant Art

There are generally pyroelectric sensors which generate an electric output signal in response to absorbed thermal energy emitted by a moving as well as a stationary thermal body. Many known sensor configurations have heretofore been disclosed to provide particular operating characteristics and intended functional performance. However, with all of such known sensor configurations, problems remain both in efficiently providing precise electrode patterns to a pyroelectric ceramic element and in effectively precluding thermal disturbance or diffusion to and from the element.

SUMMARY OF THE INVENTION

The present invention provides a pyroelectric infrared sensor particularly adapted for use in intrusion alarm systems, and which introduces modified patterns of the electrode surface to facilitate low-cost, reliable manufacture.

The sensor in accordance with the present invention comprises a pyroelectric ceramic element provided with two pairs of electrodes on front and back surfaces, and mounted on a holding member having platforms confronting the portion of the non-electrode area of the ceramic element, and a resin-molded field-effect transistor (FET) of a sufficient height to minimize thermal disturbance from and diffusion out of the back of the ceramic element.

The above-described arrangement is housed in a protective metal can provided with a square roof aperture to which is bonded an optical filter.

The patterns of the electrodes are so designed and configured as to permit a single printing process rather than a twofold process, thus eliminating isolation of the central non-electrode area which has heretofore been an inevitable result of the conventional quadrant frame pattern of the front electrodes of known sensing elements.

The above and other objects and details of the present invention will become apparent from the following description, when read in conjunction with the accompanying drawings.

BRIEF DESCRIPTION OF THE DRAWINGS

FIGS. 2a–2c illustrate a conventional twofold printing process of front electrodes, wherein:

FIG. 2a shows the first stage printing of a pair of vertical electrodes on a wafer;

FIG. 2b shows the second stage printing of a pair of horizontal electrodes on the wafer; and FIG. 2c shows the final image of electrodes with a central isolation area.

FIG. 6 is an exploded perspective view of a typical sensor in accordance with the present invention.

FIG. 7 is a vertical sectional view of the typical sensor according to the invention taken along line A—A' in FIG. 6, where D designates the distance between the back surface of a stem and a pyroelectric element.

DETAILED DESCRIPTION OF PREFERRED EMBODIMENTS

Figures 4A, 4B:
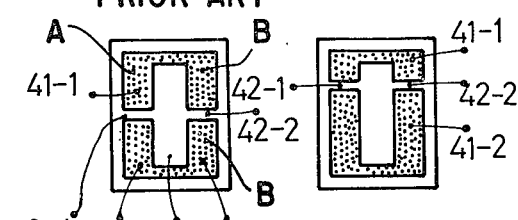
FIG. 4a depicts a typical electrode pattern according to the invention, including a pair of vertical electrodes with intermediate openings, and a central non-electrode area.
FIG. 4b shows a modified electrode pattern according to the invention with a pair of openings in vertically offset position.

A preferred embodiment of the present invention is shown in FIG. 7 and includes a pyroelectric ceramic element 4 provided with two pairs of electrodes of which the back electrodes form two parallel rectangular areas 12-1 and 12-2 (FIG. 6), and the front electrodes 41-1 and 41-2 each include regions which coincide with each of the back electrodes, and have intermediate spaces 42-1 and 42-2 therebetween as shown in FIGS. 4a and 4b. The ceramic element 4 is bonded to an underlying holding member 7 provided with platforms 71 and 72 (FIG. 6) which coincide with and confront the portion of the non-electrode area of the element 4. An FET 8 which may be suitably molded of a resin supports the holding member 7 and is disposed on a metal stem 9 provided with an integral tab 9a. The inside arrangement thus disposed on the stem 9 is housed in a protective metal can 2 provided with a square roof aperture or window 21 to which is bonded an optical filter 1. The bottom periphery of can 2 is hermetically sealed to the outer periphery of stem 9. Electrical terminals of the FET 8 can be connected in any practical manner to a receiving device via the sensor terminals.

Figures 1A, 1B:
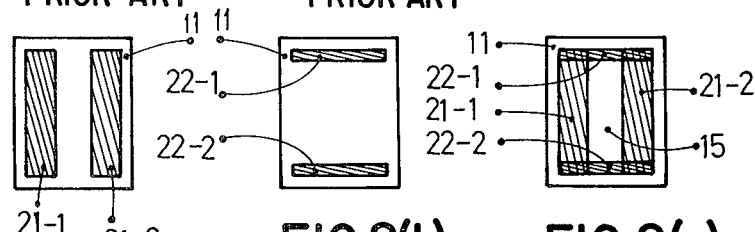
FIG. 1a is a back view of a pyroelectric element with a pair of back electrodes.
FIG. 1b is a front view of a pyroelectric element with electrodes in conventional configuration showing a pair of vertical electrodes connected with a pair of horizontal electrodes, leaving a centrally isolated non-electrode area.

Conventional patterns of electrodes are shown in FIGS. 1a and 1b, wherein electrodes 12-1 and 12-2 are provided on the back of a pyroelectric ceramic element proper 11 (hereinafter referred to as "wafer") and electrodes 13-1 and 13-2 are provided on the front of the wafer 11 so as to coincide with back electrodes 12-1 and 12-2, with electrical contact with each other being provided by means of a pair of bridges 14-1 and 14-2. Provision of electrodes on the surfaces of wafer 11 is possible by two known methods: one comprising a photo-etching process by which method the entire surface is first vacuum-evaporated, electro-plated, metal sprayed or otherwise coated with a particular photosensitive emulsion and then, after projection of either negative or positive images of the electrodes, undesired portions are removed; and the other method comprising stencil printing, in which a shadow-masking stencil plate covers non-printing areas and electrode portions are vacuum-evaporated through pre-designed image openings of the stencil. In the former method, close and precise application of various photo-resistors is physically unattainable since the surface of a wafer is not smooth but rather is roughly finished so as to minimize surface reflection of infrared rays for yielding the best heat absorbtion coefficiency. Further, a roughly finished surface makes perfect washing off of the excess etching chemicals unattainable, so that the remaining etching agent is likely to have undesirable future affects on the finished products. Accordingly, such method will not be further discussed in the present disclosure.

Figures 2A, 2B, 2C:
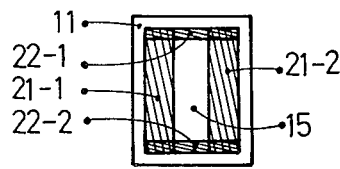

The latter aforesaid method, which employs stencil plates of desired electrode patterns, involves no difficulties in vacuum-evaporating the back electrodes which consist of two independent oblong rectangles. Problems do arise, however, when printing the front electrode pattern which, as shown in FIG. 1b, consists of two vertical electrodes 13-1 and 13-2 and two horizontally connecting electrodes 14-1 and 14-2, leaving a centrally isolated non-electrode area 15. Since physical support of the isolated masking piece is impossible without arms or brackets, a twofold process has conventionally been employed as shown in FIGS. 2a–2c, in which two vertical electrodes 21-1 and 21-2 are first provided by means of one mask, to which are then overlapped two horizontal electrodes 22-1 and 22-2 by means of a second mask, matching the four corner portions with utmost precision to produce an accurate quadrangular frame-shaped electrode pattern as shown in FIG. 2c. The twofold method, from the viewpoint of mass productivity, has a major disadvantage in that marketability is decreased due to the relatively high production cost of the products, since the matching of the two stencils with utmost precision in the two-staged vacuum-evaporation process is inefficient and time-consuming.

The present invention has been derived from extensive study into the functional principles of pyroelectric detectors followed by a series of experiments, for the sole purpose of developing sensors of superior marketability.

Figure 3:
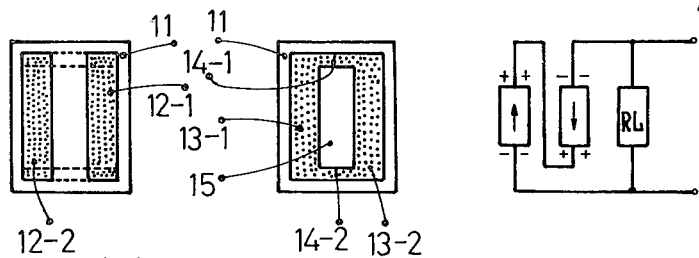
FIG. 3 is a diagrammatic representation of the operating principle of two coupled pyroelectric elements with a load resistor RL connected thereto.

As to the functional principles, reference is made to FIG. 3 (see also the periodical "Kagaku (Science)", June 1978, Vol. 200, No. 23, P1371) in which, for detecting infrared radiation generated and emitted by a human intruder of a certain body temperature, two pieces of pyroelectric element 31 and 32 are electrically connected. Upon appearance and movement of an intruder as a thermal emitter, and when one element 31 responds to the infrared radiation, the outer element 32 functions as a capacitor, and thus electric potentials come to exist between the two terminals of a load resistor RL as an initial signal. When both elements respond simultaneously to the same temperature, e.g., by uniform rise of atmospheric temperature with a rise in room temperature, no electric signal is produced between the two terminals of the load resistor RL due to the counterbalancing polarities of each signal produced at each sensing element. This counterbalance is possible because electric potentials are of the same value, and it is this property of the electric potential being equal between each of the vertical electrodes 21-1 and 21-2 that has led to the present invention which enables mass production of the novel sensor without functional detraction therefrom.

A typical configuration of the electrode pattern in accordance with the present invention is shown in FIG. 4a in which two front electrodes 41-1 and 41-2 each includes a first region A and a second region B which coincide in shape and area with portions of each of the back electrodes, respectively, on the other side (not shown) of wafer 11. The first regions A of the front electrodes 41-1 and 41-2, separated by space 42-1, each overlap with part of one of the back electrodes; and the second regions B of the front electrodes, separated by space 42-2, each overlap with part of the other of the back electrodes. The first regions A and the second regions B have a ratio of areas of approximately 1:1, while the spaces 42-1 and 42-2 are also substantially equal. Printing of the entire electrode pattern is accomplished in a single vacuum-evaporating process by the use of a shadow-masking stencil plate 53 (FIG. 5), of which the central square 51 for covering the central non-electrode area 40 of the wafer 11 is supported by two integral bridges 52-1 and 52-2. The shadow-masking stencil plate 53 is also provided with two openings or blanks 50-1 and 50-2 corresponding to the front electrodes 41-1 and 41-2, respectively. Because the electrode pattern in accordance with the invention requires only one single printing process, it eliminates the aforementioned disadvantages and consequently improves dimensional accuracy of the electrodes and increases productivity of the sensor.

Referring to FIG. 4b, there is shown a modified electrode pattern with the openings 42-1 and 42-2 in an offset position, i.e., located non-symmetrically about the horizontal axis, based on the aforesaid principle.

Figures 4C, 5:
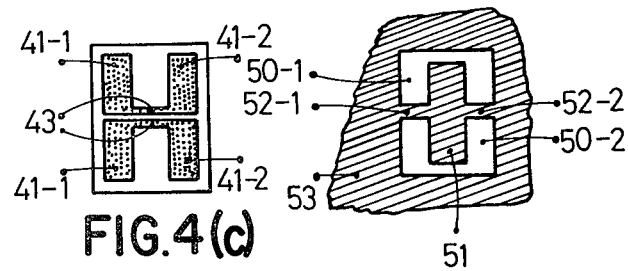
FIG. 4c shows further embodiment of an electrode pattern according to the invention.
FIG. 5 depicts a negative stencil mask for use in printing front electrodes with a pair of perforated portions corresponding to a pair of front electrodes and a central square portion to mask the central non-electrode area of the element supported by two integral bridges.

A further embodiment with a modified electrode pattern in accordance with the invention is shown in FIG. 4c. It will be understood that the back electrodes 12-1 and 12-2 of the preferred embodiment of the invention as described with reference to FIGS. 6 and 7 are substantially the same as the like-numbered back electrodes shown in FIG. 1(a), i.e., the back electrodes 12-1 and 12-2 comprise two parallel rectangular areas.

The pyroelectric ceramic element 4 provided with an improved front electrode pattern is disposed in a novel structure in accordance with the present invention.

Conventionally, a pyroelectric element is disposed directly upon the surface of a stem, or a thin alumina sheet is interposed therebetween. Two major disadvantages are inherent in this type of disposition method in which the thermosensitive element is disposed in close proximity to the stem and in integral contact with an adjacent stem or an alumina sheet. One such disadvantage resides in the fact that the element is contaminated by the thermal energy conduction from the adjacent body, and the other disadvantage resides in the fact that part of the thermal energy received by the element escapes to the adjacent body. In either or both cases, the pyroelectric characteristic of the element as thermoreceptor is significantly detrimentally affected. The first advantage can better be understood with reference to the mode of application of a sensor to an intrusion alarm device where a pyroelectric element is positioned at the focus of a mirror reflector with its head confronting the reflective surface of the mirror so that the bottom section of the sensor stem is exposed to the infrared radiation from a thermal body. When a pyroelectric element is adjacent to or only slightly separated with an interposed thin alumina sheet, a portion of thermal energy received by the stem is unavoidably conducted to the pyroelectric element, which in turn is seriously heated and thus fails to sense the true difference in thermal energy between an initial value and a higher value produced by the convergence of the reflected infrared thermal radiation. More precisely, the relation between the effective signal (Se) and contributing temperature factors (Tt, Ts and Ti) is shown in the following proportional expression:

$$Tt-(Ts+Ti)\alpha Se$$

(where Ti equals the initial temperature of the element, Tr equals the true temperature of the element heated solely by the convergent radiation energy, and Ts equals spurious secondary temperature rise).

From the above expression, it is obvious that the effective signal (Se) is greater the lower the secondary rise (Ts) is held down.

The second disadvantage of the conventional sensor structure is the diffusion of thermal energy from a pyroelectric element to an adjacent body such as an underlying sensor stem or an interposed thin alumina sheet. Upon reception of prescribed thermal energy by the element, a portion of the energy escapes to the adjacent body because of the large area of contact with such adjacent body, reducing the range of temperature fluctuation and thus detracting from the response characteristic, i.e., frequency characteristic of the sensor.

The present invention was arrived at after extensive studies in order to overcome the above-described technical problems. A typical structure according to the invention is shown in an exploded perspective view in FIG. 6 and in the vertical sectional view of FIG. 7, sectioned along the line A—A' in FIG. 6, with adhesive 31 being omitted from FIG. 6 and wire leads being omitted from FIGS. 6 and 7. The first disadvantage is overcome with the novel structure of the present invention by interposing a resin-molded FET 8 between a pyroelectric element 4 and the bottom surface 91 of a stem 9, so that the distance (D) between the two members can be sufficiently provided. The second disadvantage is overcome by preventing any thermally diffuse body from directly confronting the effective area of the back electrodes 12-1 and 12-2, so that a prompt thermal responsiveness of the effective area to the thermal radiation received thereby can be obtained through window 21. In accordance with the invention, the holding member 7 is so designed that the portions confronting the effective areas of pyroelectric element 4 are grooved to leave platforms 71 and 72, and holding member 7, after being applied with a prescribed adhesive, supports element 4 but without physical contact with that portion of the electrodes 12-1 and 12-2 which overlap in part the heat-absorbing front electrodes 41-1 and 41-2. On the non-overlapping portions of the back electrodes may be provided a pair of lead wire seats.

The two aforesaid disadvantages are thus effectively overcome by the present invention: one by maximizing the distance D between pyroelectric element 4 and the bottom surface 91 of stem 9, to effect an extensive improvement in secluding a backward spurious heat input; the other by leaving the thermal responsive portions of element 4 free from any heat diffusing body, to yield prompt thermal responsiveness of element 4.

In addition to the arrangement illustrated in FIG. 7, where a rectangular filter 1 is bonded to the outside of a rectangular window, a filter 1 may be bonded from inside of a circular window, or a filter may be designed slightly smaller in size so as to engage a window as enforced with an adhesive material.

From the foregoing, it will be apparent that the present invention provides for a low-cost, high-sensitivity intrusion detector of broadened prospective field of application and high industrial value, due to an improved pyroelectric element having high precision electrodes and a novel structure minimizing backward thermal disturbance and ameliorating thermal responsiveness.

It will be understood that the foregoing description is related to improvements in the electrode patterns and the structure of the novel sensor, and self-explanatory details have been wholly or partially omitted, such as wiring or bonding, insofar as such omissions have no essential bearing on the present disclosure. Particular dimensions, nature of materials or modes and means of applying to outer devices other than specified herein will depend on desired characteristics in utilizing the invention in intrusion alarm systems.

Although there have been described what are at present considered to be the preferred embodiments of the invention, it will be understood that various modifications may be made therein, and it is intended to cover in the appended claims all such modifications as fall within the true spirit and scope of the invention.

We claim:
1. A pyroelectric infrared sensor, comprising:
a can having a window with an optical filter attached thereto;
a pyroelectric ceramic element;
a field-effect transistor provided with electric terminals; and
a stem having a tab, wherein:
said pyroelectric ceramic element has two back electrodes on the back surface thereof and at least two front electrodes on the front surface thereof, each of said at least two front electrodes having a first region overlapping with a part of one of said back electrodes and a second region overlapping with a part of the other of said back electrodes;
each of said at least two front electrodes are arranged adjacent to each other and are electrically insulated from each other; and
said first regions and said second regions of said at least two front electrodes have a ratio of areas of approximately 1:1.
2. A pyroelectric infrared sensor in accordance with claim 1, wherein:
said field-effect transistor is positioned on the surface of said stem;
a holding member supports said element and is disposed on said transistor; and
said can and stem are hermetically sealed.
3. A pyroelectric infrared sensor in accordance with claim 1, wherein:
the areas of said first and second regions of each of said at least two front electrodes occupy the major part of each of said front electrodes, respectively.
4. A pyroelectric infrared sensor in accordance with claim 3, wherein:
said two back electrodes are each substantially quadrilaterally shaped and are arranged substantially in parallel with each other.
5. A pyroelectric infrared sensor in accordance with claim 1, wherein:
said two back electrodes are each substantially quadrilaterally shaped and are arranged substantially in parallel with each other.
6. A pyroelectric infrared sensor in accordance with claim 1, wherein:
said first regions of said two front electrodes have a first space therebetween, and said second regions of said two front electrodes have a second space therebetween, said first and second spaces being substantially equal.

* * * * *